US010627535B2

(12) United States Patent
Miles

(10) Patent No.: US 10,627,535 B2
(45) Date of Patent: Apr. 21, 2020

(54) LOW-FREQUENCY RECEIVER COIL SUSPENSION SYSTEM

(71) Applicant: CGG SERVICES SAS, Massy (FR)

(72) Inventor: Philip Miles, Rockwood (CA)

(73) Assignee: CGG SERVICES SAS, Massy (FR)

( * ) Notice: Subject to any disclaimer, the term of this patent is extended or adjusted under 35 U.S.C. 154(b) by 0 days.

(21) Appl. No.: 16/410,307

(22) Filed: May 13, 2019

(65) Prior Publication Data

US 2019/0265380 A1    Aug. 29, 2019

Related U.S. Application Data

(63) Continuation of application No. 16/025,005, filed on Jul. 2, 2018, now Pat. No. 10,330,814, which is a continuation of application No. 15/308,653, filed as application No. PCT/IB2015/000964 on May 11, 2015, now Pat. No. 10,042,075.

(60) Provisional application No. 61/991,631, filed on May 12, 2014.

(51) Int. Cl.
| | |
|---|---|
| *G01V 3/08* | (2006.01) |
| *G01V 3/16* | (2006.01) |
| *G01V 3/165* | (2006.01) |
| *G01V 3/15* | (2006.01) |
| *G01R 1/14* | (2006.01) |
| *G01R 33/00* | (2006.01) |
| *G01V 3/10* | (2006.01) |

(52) U.S. Cl.
CPC ............... *G01V 3/165* (2013.01); *G01R 1/14* (2013.01); *G01R 33/0047* (2013.01); *G01V 3/08* (2013.01); *G01V 3/102* (2013.01); *G01V 3/108* (2013.01); *G01V 3/15* (2013.01); *G01V 3/16* (2013.01); *G01V 3/081* (2013.01); *G01V 3/082* (2013.01)

(58) Field of Classification Search
CPC ... G01V 3/02; G01V 3/08; G01V 3/01; G01V 3/165
USPC .......................... 324/323, 330, 331, 345, 376
See application file for complete search history.

(56) References Cited

U.S. PATENT DOCUMENTS

| | | | |
|---|---|---|---|
| 6,876,202 B2 | 4/2005 | Morrison et al. | |
| 7,157,914 B2 | 1/2007 | Morrison et al. | |
| 8,362,779 B2 | 1/2013 | Kuzmin et al. | |

(Continued)

FOREIGN PATENT DOCUMENTS

| | | |
|---|---|---|
| JP | 2000291725 A | 10/2000 |
| WO | 2010071991 A1 | 7/2010 |

OTHER PUBLICATIONS

F. Garoi et al., "Passive Vibration Isolation Using a Roberts Linkage", Review of Scientific Instruments, Jul. 2003, Vo.. 74, No. 7, pp. 3487-3491.

(Continued)

*Primary Examiner* — Raul J Rios Russo
(74) *Attorney, Agent, or Firm* — Patent Portfolio Builders PLLC

(57) ABSTRACT

An electromagnetic (EM) receiver system for measuring EM signals. The EM receiver system includes a platform; a coil for measuring EM signals; and first to third suspension mechanisms located between the platform and the coil so that the coil oscillates relative to the platform, and the first to third suspension mechanisms attenuate motion induced noise introduced by towing the receiver system above ground.

15 Claims, 15 Drawing Sheets

(56) References Cited

U.S. PATENT DOCUMENTS

| | | | | |
|---|---|---|---|---|
| 2009/0278540 | A1* | 11/2009 | Kuzmin | G01V 3/165 324/330 |
| 2010/0188089 | A1* | 7/2010 | Kuzmin | G01V 3/165 324/330 |
| 2010/0244843 | A1* | 9/2010 | Kuzmin | G01V 3/165 324/345 |
| 2011/0115489 | A1 | 5/2011 | Morrison et al. | |
| 2011/0175604 | A1* | 7/2011 | Polzer | G01R 33/022 324/246 |
| 2011/0272522 | A1 | 11/2011 | Kuzmin et al. | |
| 2013/0307545 | A1* | 11/2013 | Morrison | B64D 3/00 324/330 |
| 2015/0369944 | A1* | 12/2015 | Miles | G01V 3/165 324/331 |

OTHER PUBLICATIONS

International Search Report, dated Nov. 5, 2015, from corresponding/related International Application No. PCT/IB2015/000964.
Office Action, dated Sep. 20, 2018, from corresponding/related U.S. Appl. No. 16/025,005.
Office Action, dated Sep. 7, 2017, from corresponding/related U.S. Appl. No. 15/308,653.
Written Opinion of the International Searching Authority, dated Nov. 5, 2015, in corresponding/related International Application No. PCT/IB2015/000964.
Examination Report dated Nov. 25, 2019 in corresponding/related Australian Application No. 2015260938. (All references not cited herewith have been previously made of record.).

* cited by examiner

LOW-FREQUENCY RECEIVER COIL SUSPENSION SYSTEM

CROSS-REFERENCE TO RELATED APPLICATIONS

This application is a continuation of U.S. patent application Ser. No. 16/025,005, filed Jul. 2, 2018, which is a Continuation of U.S. patent application Ser. No. 15/308,653, filed Nov. 3, 2016, which is a National Stage of PCT Application No. PCT/IB2015/000964, filed May 11, 2015, which is related to, and claims priority and benefit from U.S. Provisional Patent Application No. 61/991,631, filed May 12, 2014, entitled "Extremely Low Frequency Coil Suspension System," the entire disclosure of which is incorporation herein by reference.

BACKGROUND

Technical Field

Embodiments of the subject matter disclosed herein generally relate to methods and systems and, more particularly, to mechanisms and techniques for electromagnetic (EM) measurements using an EM receiver that is towed above ground with a carrier.

Discussion of the Background

EM surveying is a method of geophysical exploration to determine the properties of a portion of the earth's subsurface, information that is especially helpful in the oil and gas industry. EM surveys may be based on a controlled source that sends EM energy waves into the earth, which induces eddy current in the earth. The eddy currents generate a secondary EM field or ground response. By measuring the secondary field with an EM receiver, it is possible to estimate the depth and/or composition of the subsurface features. These features may be associated with subterranean hydrocarbon deposits.

A schematic airborne EM survey system 100 generally includes, as illustrated in FIG. 1, a transmitter 102 for generating a primary electromagnetic field 104 that is directed toward the earth. When primary EM field 104 enters the ground 108, it induces eddy currents 106 inside the earth. These eddy currents 106 generate a secondary electromagnetic field or ground response 110. An EM receiver 112 then measures the response 110 of the ground. Transmitter 102 and receiver 112 may be connected to an aircraft 114 so that a large area of the ground is swept. Receiver 112 may be located concentric with transmitter 102. The currents induced in the ground are a function of the earth's conductivity and, of course, the transmitter characteristics. By processing and interpreting the received signals, it is possible to study and estimate the distribution of conductivity in the subsurface. The distribution of conductivity is associated with the various layers 116 and 118 making up the subsurface, which is implicitly indicative of the location of oil and gas reservoirs and/or other resources of interest for the mining industry.

In EM geophysics, the signals of interest sometimes have low, if not ultra-low, frequency. For example, the frequency spectrum of electromagnetic signals ranges from the excitation frequency (e.g., 25 Hz) to over 100 kHz. High-frequency energy occurs a short time after the transmitter's excitation. However, at later times, low-frequency energy exists. The exploration depth associated with an EM survey system depends on the low-frequency ground response. However, during an EM survey, low-frequency motion noise is generated. If the motion-induced noise is too strong, the recorded signals may become useless from an exploration point of view. The EM survey system's accuracy depends on the ability to separate low-frequency motion noise from low-frequency ground response.

EM receivers in an EM survey system are also sensitive to motion-induced noise as the receiver moves through the earth's magnetic field (noise due to towing the coil above ground). Motion-induced noise may be several orders of magnitude larger than the ground response at low frequencies.

While some efforts have been made to directly measure and compensate for receiver coil motion (see, e.g., U.S. Pat. No. 6,876,202, the entire content of which is incorporated herein by reference) to improve the exploration depth for both passive and active airborne EM surveys, most contractors have developed sophisticated suspension systems to isolate the receiver coil from various motion-induced noise (i.e., towing noise) sources, which include: buffeting of the enclosure as it moves through turbulent air, natural resonance of the receiver's supporting structure, motion of the aircraft as it adjusts to maintain its target flight path, and mechanical vibrations of the aircraft and engines.

A typical receiver coil suspension system is implemented with either one or two stages of elastic members connecting the receiver coil to the outer structure. In this regard, see, for example, FIGS. 2A and 2B corresponding to FIGS. 4A and 2A, respectively, of U.S. Pat. No. 8,362,779, the contents of which are incorporated herein by reference. FIG. 2A is an overall view of a receiver coil frame 24 that includes a frame 12 for supporting receiver coil 14 and rings 16, while FIG. 2B is a cross-section showing how receiver coil 14 is suspended with inner suspension members 10 from frame 12, and frame 12 is suspended with suspension members 20 from rings 16. This design includes two stages of elastic members supporting a single axis receiver coil 14.

However, the two-stage suspension illustrated in FIGS. 2A and 2B doubles the high-frequency attenuation roll-off, at the expense of introducing additional low-frequency modes that cause the low-frequency behavior to deteriorate. In this regard, FIG. 3 compares the response 300 of a receiver coil having a single-stage suspension system to the response 302 of a receiver coil having a dual-stage suspension system, both normalized to the electronic noise floor 304 for typical airborne EM receivers. The electronic noise floor 304 represents the noise induced by the electronics associated with the receiver coil. Any response that is above electronic noise floor 304 is unusable for determining the configuration of the earth beneath its surface. The single-isolation stage is superior at frequencies below 5 Hz. However, the dual-isolation stage falls below the electronic noise floor at approximately 25 Hz, meaning that measurements above 25 Hz can be used to characterize the subsurface.

A relationship between EM receiver isolation and electronic noise floor defines the lowest practical base frequency for a given EM system, limiting all known systems to approximately 25 Hz (i.e., traditional EM systems cannot produce a useful signal below 25 Hz). Since depth of exploration and base frequency are directly related, a more advanced suspension system is desirable to allow base frequencies throughout the Extremely Low-Frequency (ELF) band of 3 Hz to 30 Hz to significantly improve overall depth of exploration of EM systems. Thus, there is a need to develop a new suspension system that allows base frequencies throughout the ELF band.

SUMMARY

According to one embodiment, there is an electromagnetic (EM) receiver system for measuring EM signals. The EM receiver system includes a coil assembly including a receiver coil configured to measure an EM signal and a first elastic member that allows the coil assembly to oscillate; an inner cage configured to house the coil assembly, the coil assembly being linked to the inner cage through a second elastic member; and an outer cage configured to house the inner cage, the inner cage being linked to the outer cage through a third elastic member. Each of the first to third elastic members is configured to allow the coil assembly to oscillate relative to the outer cage and each elastic member damps a motion of the receiver system when towed during an EM survey.

According to another embodiment, there is an electromagnetic (EM) receiver system for measuring EM signals, the EM receiver system including a platform; a coil for measuring EM signals; and first to third suspension mechanisms located between the platform and the coil so that the coil oscillates relative to the platform, and the first to third suspension mechanisms attenuate motion induced noise introduced by towing the receiver system above ground.

According to still another embodiment, there is a method for attenuating motion induced noise in an electromagnetic (EM) receiver system for measuring EM signals. The method includes providing a platform; and attaching a coil for measuring EM signals to the platform with first to third suspension mechanisms. The coil oscillates relative to the platform and the first to third suspension mechanisms attenuate the motion induced noise introduced by towing the receiver system above ground.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of an EM system having EM receivers oriented along a vertical axis and recording EM fields related to geophysics. However, the embodiments to be discussed next are not limited to geophysics; they may be applied to other fields.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, an electromagnetic receiver system includes a platform, a coil for measuring EM signals, and first to third suspension stages located between the platform and the coil so that the coil can oscillate relative to the platform. The first to third suspension stages attenuate motion-induced noise introduced by towing the receiver system above ground.

Figure 4:
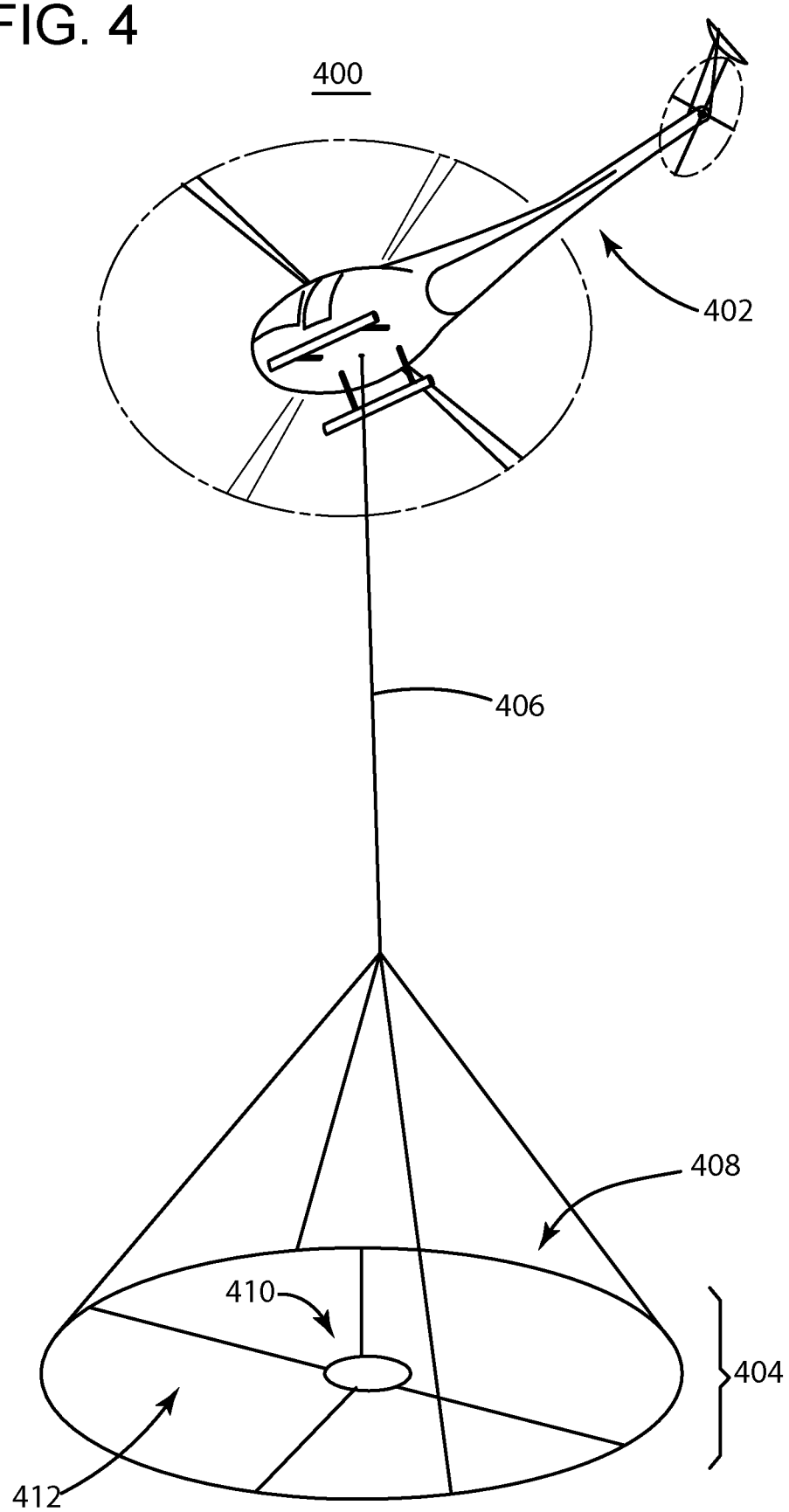
FIG. 4 is a schematic diagram of an aircraft towing an EM transmitter system and a receiver system above ground for investigating a configuration of the earth.

More specifically, as illustrated in FIG. 4, an EM survey system 400 includes an aircraft 402 (e.g., a helicopter) that tows an EM system 404. Towing equipment 406, which includes one or more links (e.g., ropes, cables, wires, etc.) connects aircraft 402 to EM system 404. EM system 404 includes at least an EM transmitter assembly 408 and an EM receiver assembly 410. As previously discussed, the EM transmitter assembly is configured to generate a primary EM field and the EM receiver assembly 410 is configured to record a secondary EM field, generated by the earth, in response to the primary EM field. EM receiver assembly 410 is suspended from EM transmitter 408 by a primary suspension system 412. Primary suspension system 412 is known in the art, and it may include ropes for connecting the receiver and transmitter assembles to each other.

Figure 5A:
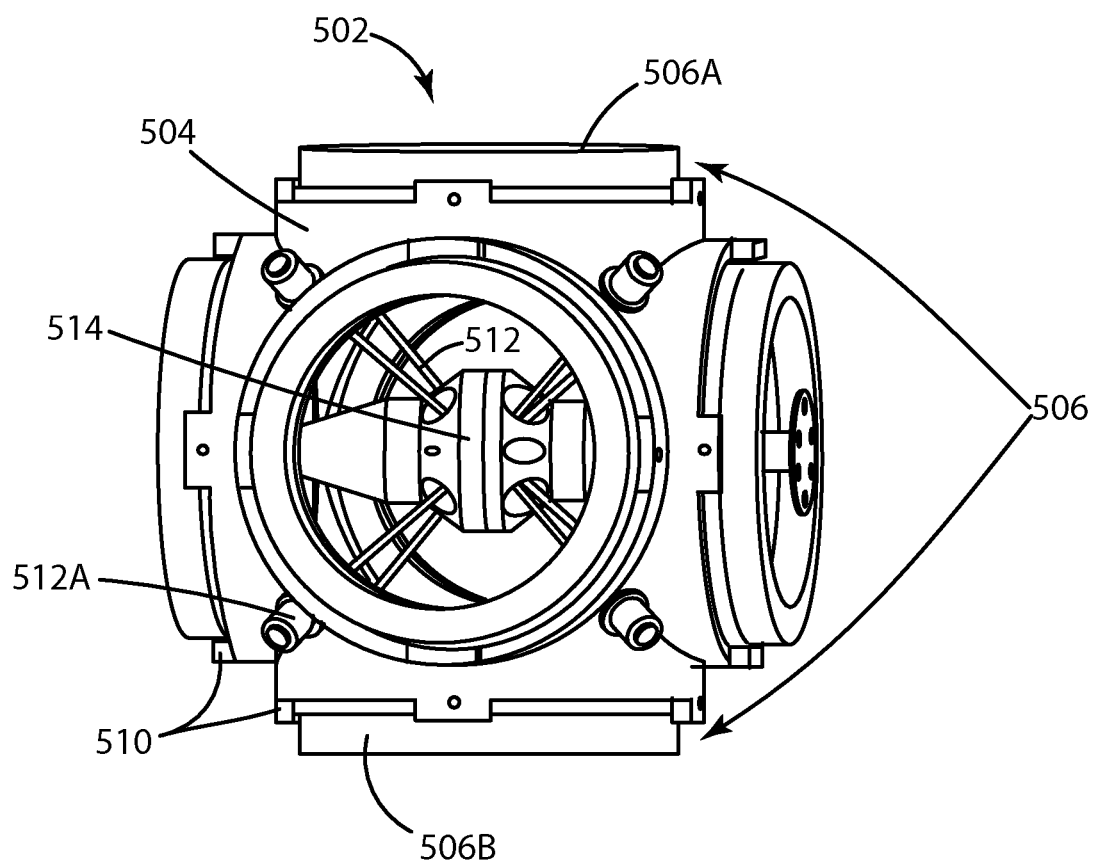
FIG. 5A is a schematic diagram of a coil assembly used in an EM receiver system.

EM receiver assembly 410 includes various elements as, for example, coil assembly, platform, ropes, secondary suspension system, etc., some of which are discussed now in more detail. FIG. 5A shows a coil assembly 502 that has a coil support 504 shaped to support receiver coils 506. One skilled in the art would understand that the specific shape of the coil support shown in FIG. 5A is exemplary and not intended to limit the invention. In one embodiment, coil support 504 is configured to house three pairs of coils, one for each axis of an orthogonal system of axes XYZ.

The embodiment illustrated in FIG. 5A shows receiver coils 506 (those arranged to record the Z component of the magnetic field or a quantity related to the magnetic field) being physically split in half, with a first half 506A mounted on top of the coil support 504 and the other half 506B mounted at the bottom of the coil support. While it is possible to connect the two halves of the receiver passively, a summing amplifier 510 may be used to combine the measured voltages. Note that summing amplifier 510 may be located on the coil support or on aircraft 402. Also note that receiver coils 506 may be all located at a same position on the coil support and, thus, no summing amplifier is needed.

Figure 5B:
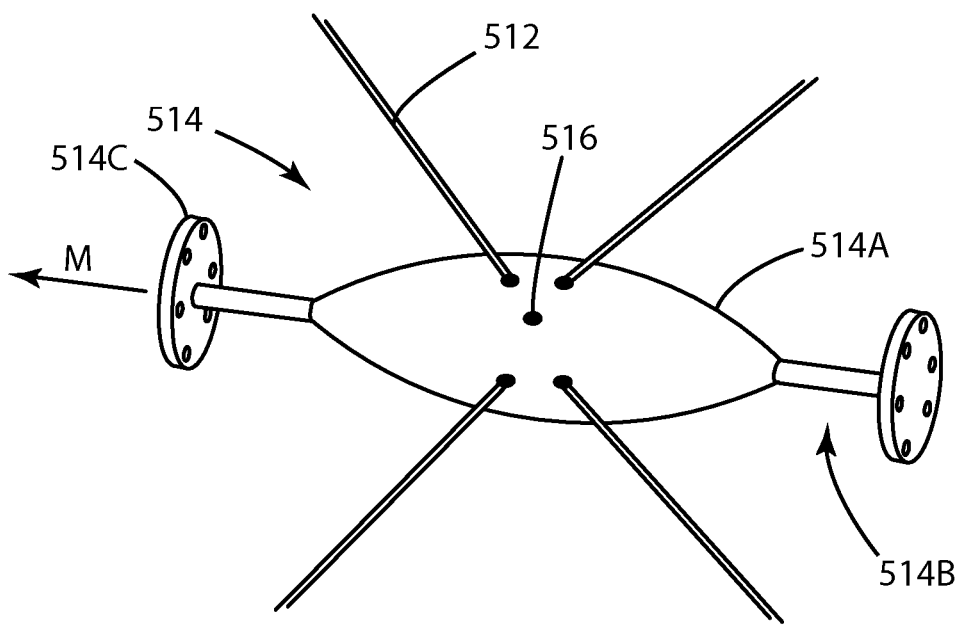
FIG. 5B is a schematic diagram of a spindle used inside a coil assembly in an EM receiver system.

Regardless of the arrangement of the receiver coils, coil support 504 is attached by first elastic member (e.g., ropes) 512 to a spindle 514 such that receiver coils 506 are free to rotate about the center of mass of coil support 504. In this embodiment, spindle 514 is located inside coil support 504. FIG. 5A shows heads 512A on the surface of coil support 504, and these heads connect to first elastic member 512. In one application, heads 512A are adjustable (e.g., they rotate relative to coil support 504) to strengthen or lessen the tension existent in each of the first elastic member 512. A first elastic member 512 may be made of any material that exhibits elasticity so that an internal tension can be adjusted as desired. In one application, first elastic member includes one or more elastic elements. An elastic element is configured to increase its length when a tension is applied along its length. In another application illustrated in FIG. 5B, spindle 514 has eight points 516 (only four are shown because the other four are obscured by the body of the spindle) equidistant from the center of mass 516 of the coil support. In one application, the center of mass of the spindle is substantially coincident with center of mass 516. In another application, the spindle has a central portion 514A that is larger in diameter than a periphery portion 514B. In yet another embodiment, spindle 514 is symmetric relative to a longitudinal axis M. Spindle 514 may also have flanges 514C for rigidly connecting to an outer ring as discussed later.

One advantage of coil assembly 502 is that receiver coils 506A are free to rotate about center of mass 516, but only at a tuned frequency, which is about 0.1 to 0.5 Hz. Note that the tuned frequency depends on the characteristics of coil assembly 502, e.g., shape, weight, etc. The first elastic member 512 makes up the first-stage isolation or suspension mechanism and has the benefit of a long radius pendulum in a relatively short height of the coil support (see, e.g., Goroi et al., 2003, Review of Scientific Instruments, vol. 74, no. 7, the entire content of which is incorporated herein by reference).

Figure 5C:
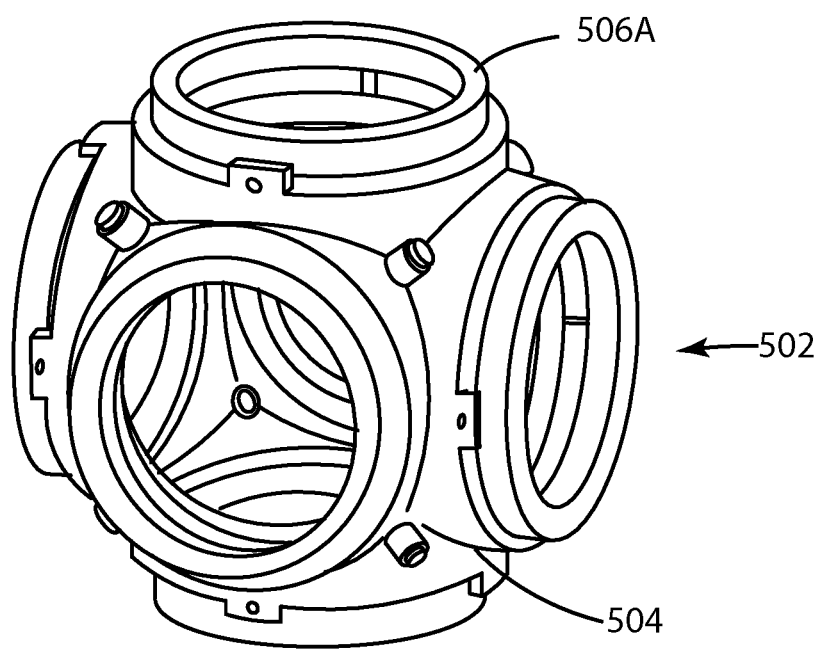
FIG. 5C is an overview view of the coil assembly.

FIG. 5C is an overview of coil assembly 502 showing a location of the receiver coils 506 relative to coil support 504. Note that in this figure first elastic member 512 and spindle 514 have been removed for clarity.

Figure 6:
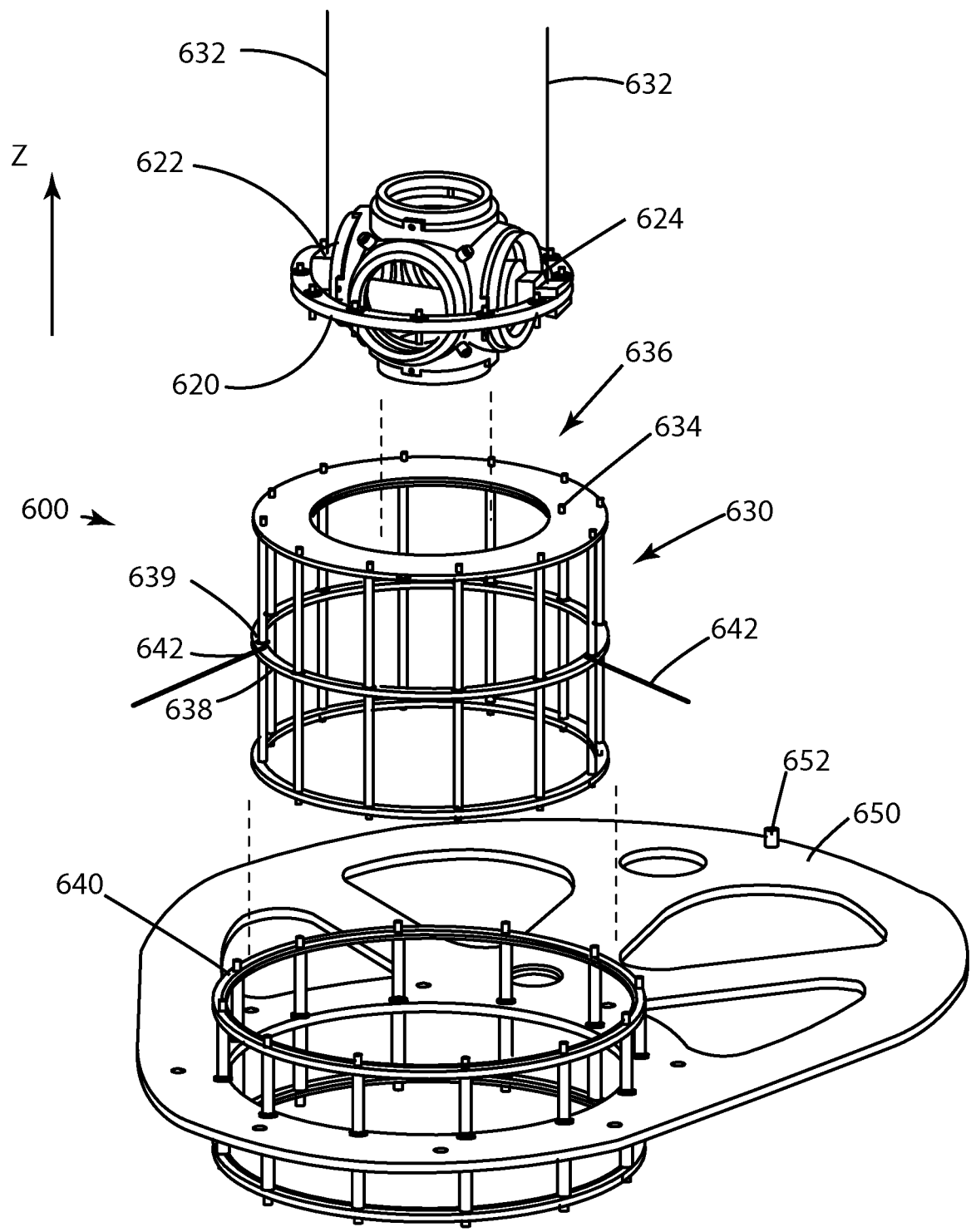
FIG. 6 is a schematic diagram of an exploded EM receiver system having a three-stage suspension mechanism.

Spindle 514, and implicitly coil assembly 502, is rigidly connected to an outer ring 620 as illustrated in FIG. 6. FIG. 6 shows the entire receiver system with the three-stages suspension mechanisms in an exploded view. For example, a bracket 622 may connect outer ring 620 to flanges 514C of spindle 514. Coil assembly 502 and outer ring 620 are immersed or housed inside an inner cage 630. Inner cage 630 may have any configuration. FIG. 6 shows an embodiment in which the inner cage is cylindrical and the side walls are replaced by rods. Inner cage 630 may include an inner ring 638 located inside inner cage 630, around its internal circumference.

Outer ring 620 provides symmetrically placed connection points 624 (between four and sixty depending on the diameter of the outer ring) that allow near-vertical suspension of coil assembly 502 from inner cage 630 using second elastic member 632. Second elastic member 632 is discussed later in more detail.

Second elastic member 632 may be connected between connection points 624 of outer ring 620 and corresponding connection points 634 located (e.g., symmetrically) around and on top of ring 636 of inner cage 630. Thus, in this embodiment, second elastic member 632 is nearly vertical. The tension of second elastic member 632 may be adjusted to resonate at about 0.5 to 1 Hz. The outer ring may also provide connection points to allow attachment of damping elements below the coil assembly, first elastic member and spindle. In practice, the damping elements are rarely used. The second elastic member constitutes the second-stage suspension mechanism.

Inner cage 630 is connected to an outer cage 640 using a third elastic member 642. Third elastic member 642, which is also discussed in more detail later, supports inner cage 630 inside outer cage 640 so that inner cage 630 can rotate relative to the outer cage. Inner cage 630 may include an inner ring 638 having connection points 639 from which one end of third elastic member 642 is attached. Third elastic member 642 may include one or more elastic elements that connect between connection points 639 and outer cage 640. Third elastic elements may be vertical, horizontal or inclined with a certain angle relative to gravity. Outer cage 640 is rigidly connected to a supporting platform 650. Supporting platform 650 may be connected at connection points 652 to primary suspension system 412 illustrated in FIG. 4. Alternatively, supporting platform 650 may be a component of EM receiver assembly 410, also illustrated in FIG. 4.

Figure 7:
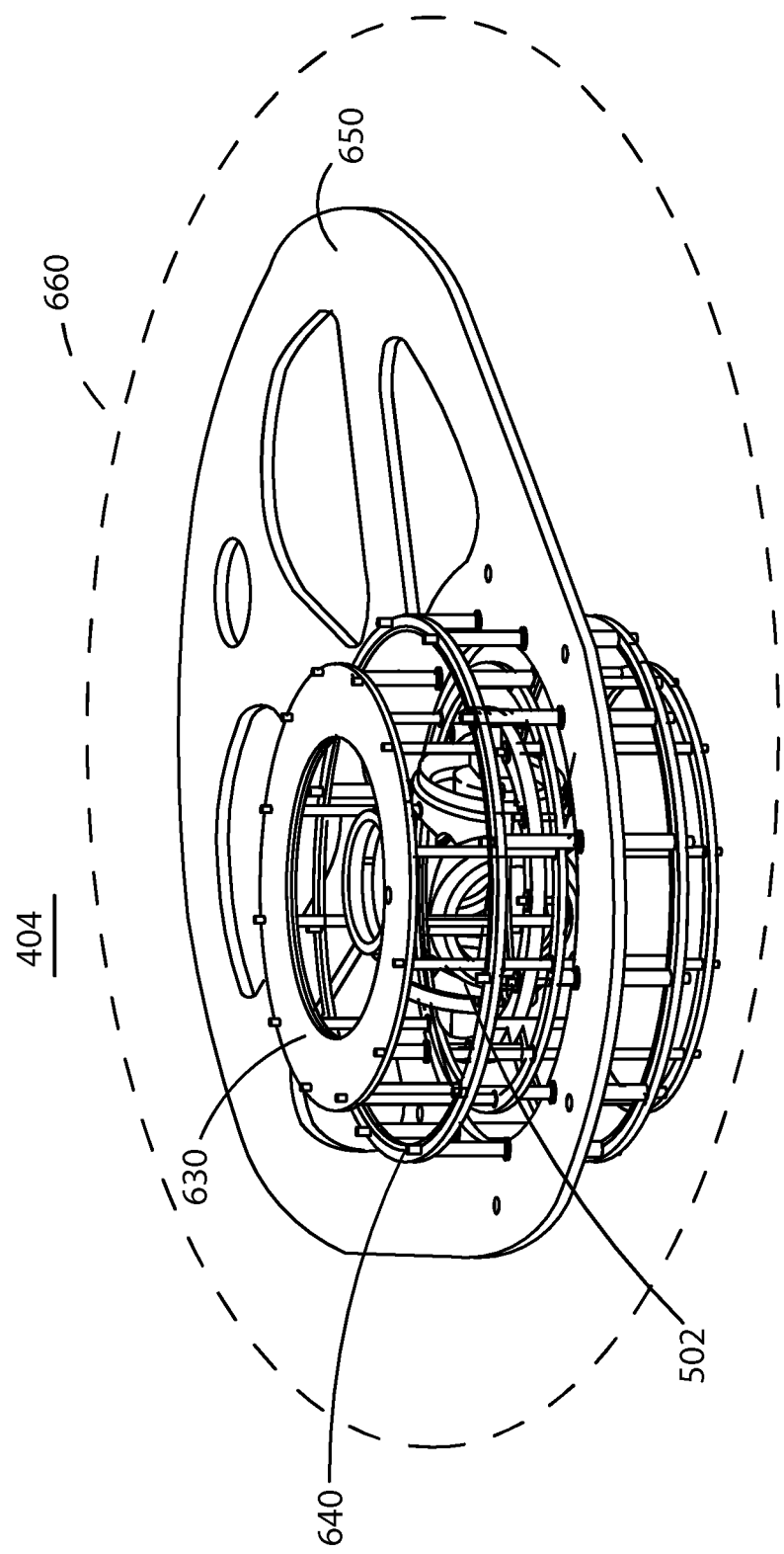
FIG. 7 is a schematic diagram of a compact EM receiver system having the three-stage suspension mechanism.

The third elastic member 642 constitutes the third-stage suspension mechanism for EM system 404 discussed above. FIG. 7 shows the entire suspension system (including all three-stage suspension mechanisms). The entire EM system 404 may be enclosed in a housing 660 for protecting it from debris, water, solar exposure, etc. Housing 660 may be formed from removable upper and lower domes connected directly to platform 650.

The first to third elastic members can be combined in different ways, depending on the required base frequency and physical size constraints (helicopters can typically carry larger receivers than fixed-wing aircraft).

Figure 8:
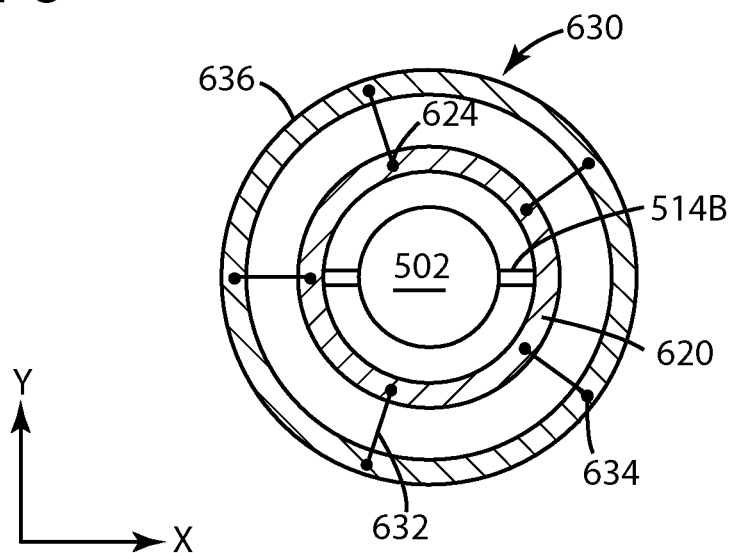
FIG. 8 is a top view of a second-stage mechanism between the coil assembly and inner cage.

According to an embodiment illustrated in FIG. 8, coil assembly 502 is attached to inner cage 630 as follows. Second elastic member 632 includes plural elastic elements (e.g., ropes, wires) that connect between connection points 624 of outer ring 620 to connection points 634 of top ring 636, which is associated with inner cage 630. The plural elastic elements may be distributed as shown in FIG. 8, i.e., vertically (note that FIG. 8 is a top view of the above-noted elements, with Z axis coming out of the page and, thus, elastic members being parallel to axis Z). In one embodiment, the plural elastic elements may be arranged to make an angle with the vertical, e.g., to cross each other or to be positioned in any way that ensures that oscillations induced into the inner cage 630 are damped when propagating to coil assembly 502. Note that an elastic member damps selected frequencies depending on the characteristics of the elastic member.

Figure 9:
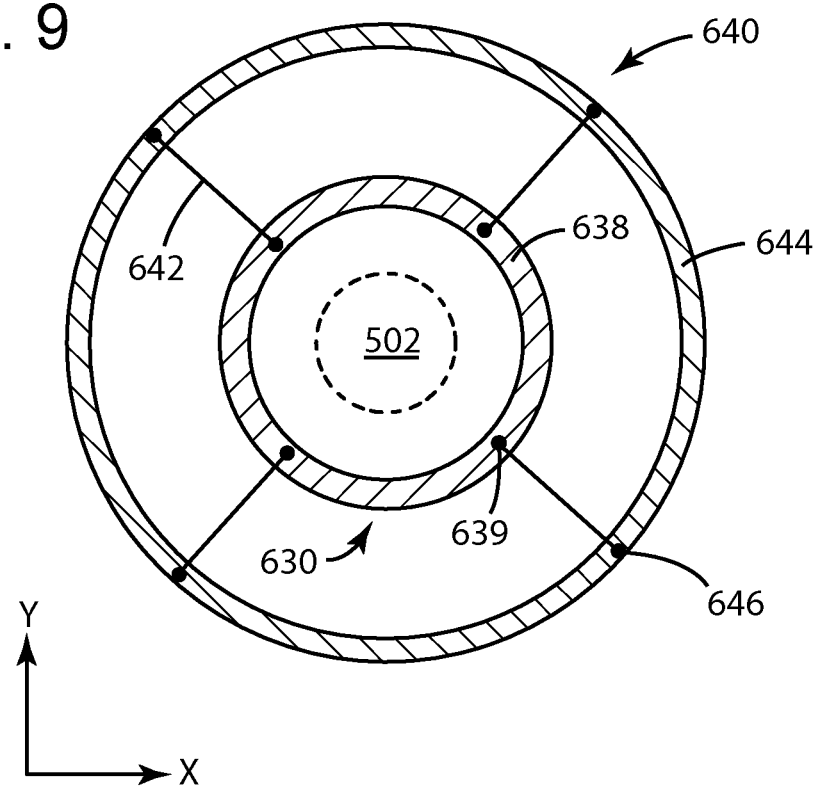
FIG. 9 is a top view of a third-stage mechanism between the inner cage and the outer cage.

Inner cage 630 may be connected to outer cage 640 in a manner as illustrated in FIG. 9. Inner ring 638 of inner cage 630 is connected to ring 644 of outer cage 640 through third elastic member 642. Third elastic member 642 may include plural elastic elements, each element connecting between a connection point 639 of inner ring 638 and a corresponding connection point 646 on ring 644 of outer cage 640. The plural elastic elements may be distributed vertically, as shown in FIG. 9, or to cross each other or to be positioned in any way that ensures that oscillations induced into outer cage 640 are damped when propagating to inner cage 630.

Figure 10:
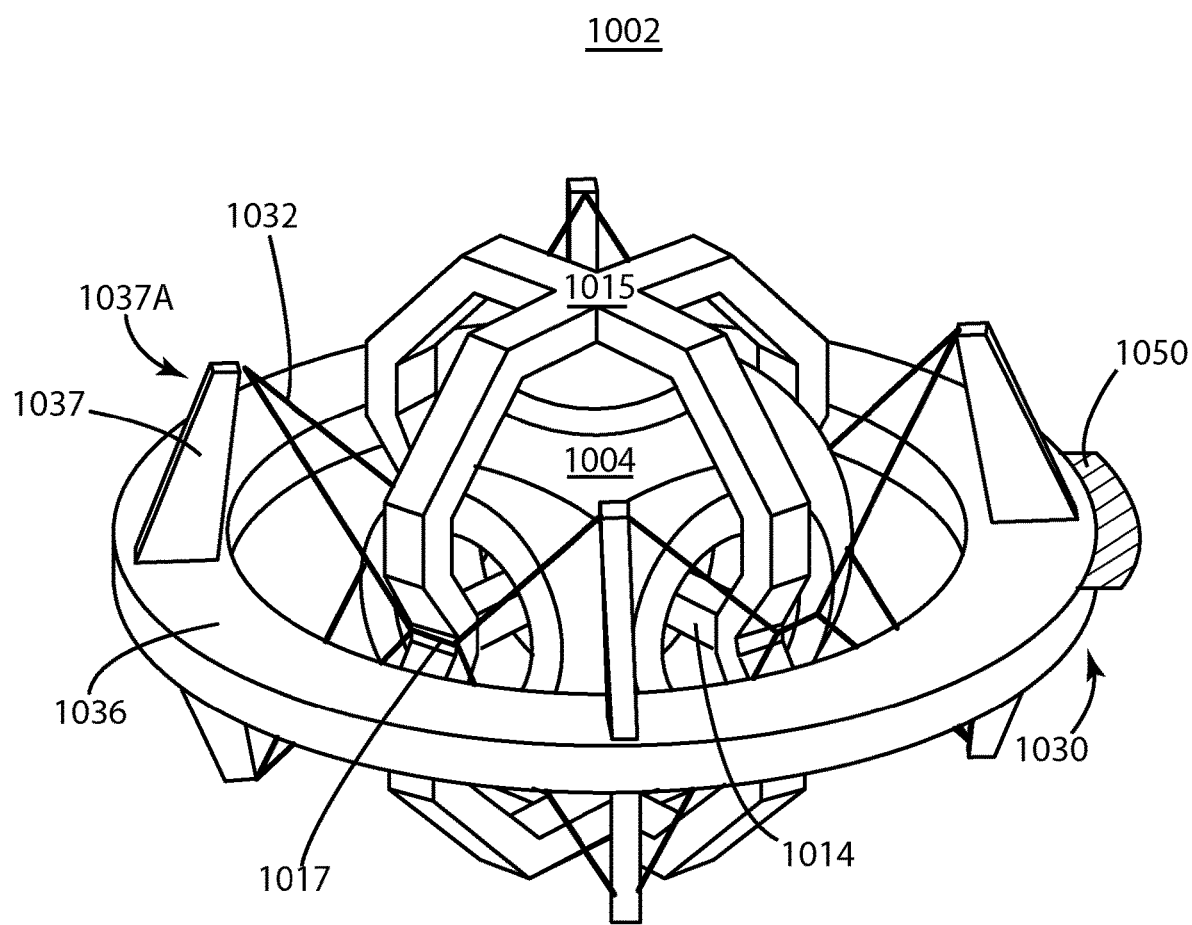
FIG. 10 is a schematic diagram of a two-stage suspension mechanism.
Figure 11:
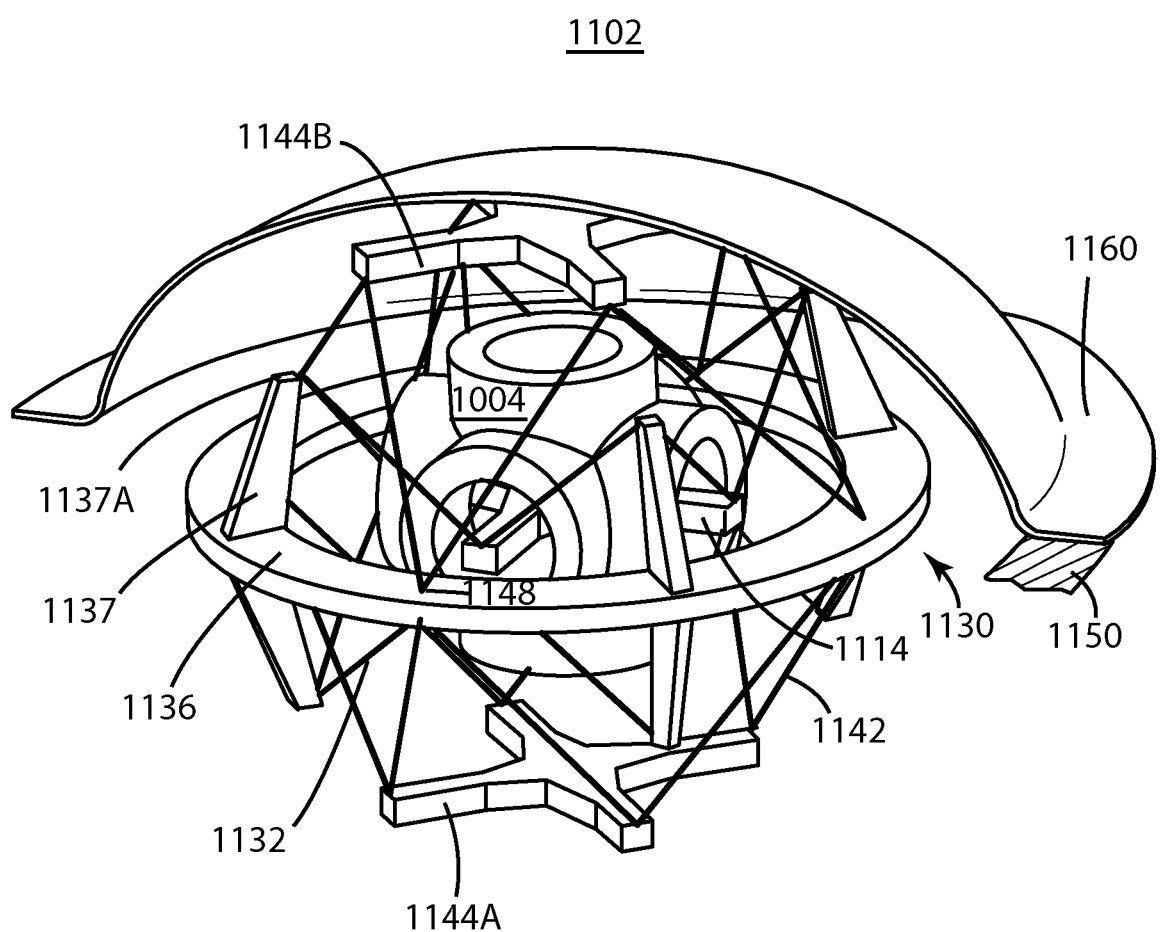
FIG. 11 is a schematic diagram of a three-stage suspension mechanism according to another embodiment.

Two other implementations of ELF elastic elements are now discussed with regard to FIGS. 10 and 11, where FIG. 10 illustrates a two-stage suspension mechanism and FIG. 11 illustrates a three-stage suspension mechanism. FIG. 10 shows a coil assembly 1002 that includes coil support 1004 and inner cage 1030 (this embodiment does not have an outer cage). Coil assembly 1002 may have the same configuration/structure as coil support 504 shown in FIG. 5A. However, spindle 514 is now replaced with a more complex one 1014 having a cross-like configuration and a frame 1015 that encircles coil assembly 1002. Spindle 1014 is rigidly attached to frame 1015.

In the embodiment illustrated in FIG. 10, spindle 1014 extends along two perpendicular axes, while frame 1015 extends in two perpendicular planes and has ports 1017 for receiving second elastic elements 1032. First elastic members are not shown for simplicity, but they may have the same shape and configuration as first elastic members 512 in FIG. 5A. Second elastic members 1032 connect to (i) tips 1037A on ring 1036 of inner cage 1030 and also to (ii) ports 1017 on frame 1015. Ring 1036 may have arms 1037 extending above and below the ring so that second elastic elements 1032 connect to ports 1017 from both above and below the ring as illustrated in FIG. 10. Ring 1036 may be fixedly connected to platform 1050, which is only partially illustrated in the figure. In one embodiment, ring 1036 has four arms on the upper side and four arms on the lower side, symmetrically distributed along the ring.

FIG. 11 shows a similar embodiment, but instead of having a two-stage suspension mechanism, it has a three-stage suspension mechanism. Except for frame 1015, all the elements from the previous embodiment are also present in this embodiment. For that reason, those elements are not discussed again. Third elastic elements 1142 of the third-stage suspension mechanism connect inner ring 1136 to two cross-like parts 1144A and 11446 that form the outer cage. One skilled in the art would note that outer cage parts 1144A and 1144B do not need to resemble an actual cage. The inner and outer cages terms are used in a generic sense to reflect some structure that may or not look like a cage. In this embodiment, outer cage parts 1144A and 1144B may have the same configuration/shape as spindle 1114. Outer cage parts 1144A and 1144B may be rigidly attached to platform 1150 by known means, e.g., bolts, welded.

One end of third elastic elements 1142 may connect to tips of outer cage parts 1144A and 1144B as shown in the figure, while the other end may connect at ports 1148, between arms 1137. Ports 1148 are attached to ring 1136. In one application, there are four ports 1148 and four arms 1137 on each side of ring 1136. In another application, the number of ports is "n" and number of arms is "m," with n and m larger than 4. In one application, the number n is different from number m. In one application, at least two elastic members extend from each port 1148 toward one of the outer cage parts 1144A or B. In one application, there are 16 elastic members constituting third elastic member 1142 and 16 elastic members constituting second elastic member 1132. These numbers can vary from application to application. A dome 1160 may be used to cover the entire coil assembly and suspension stages. Dome 1160 may be connected directly to platform 1150.

Figure 1:
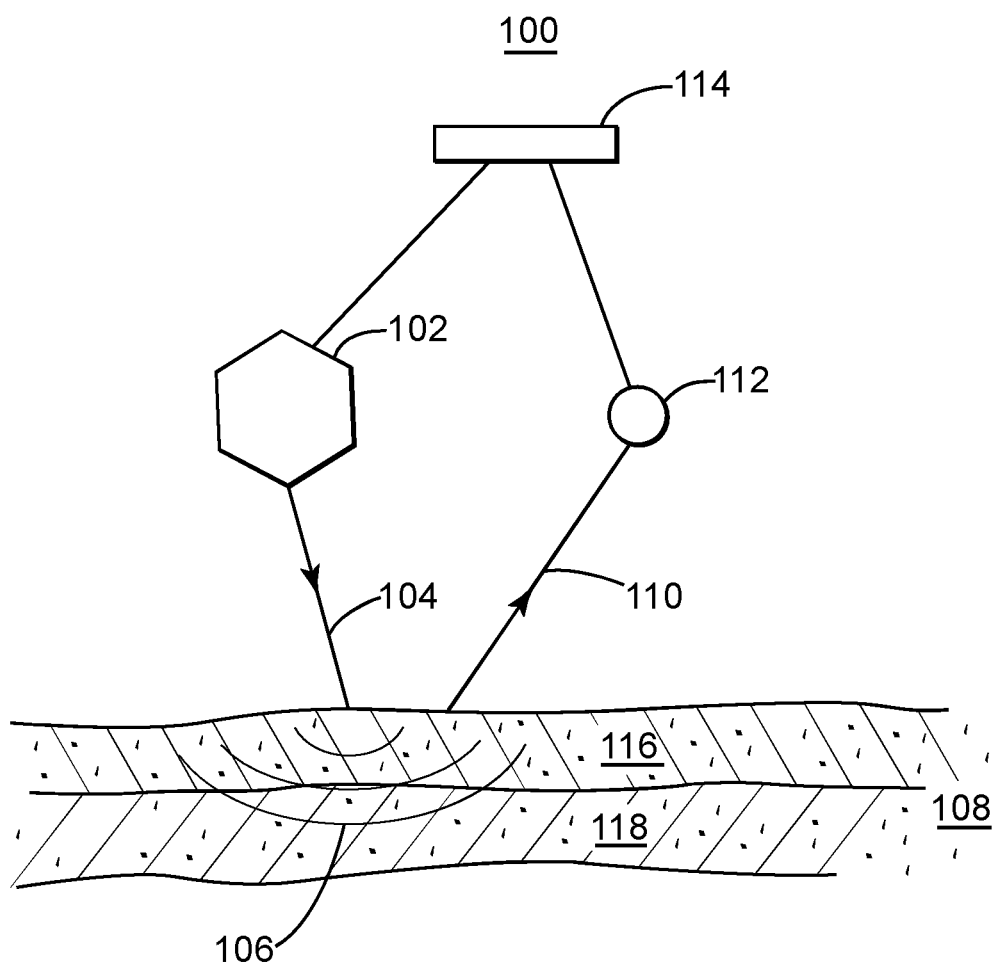
FIG. 1 is a schematic diagram of an EM acquisition system.
Figure 2A:
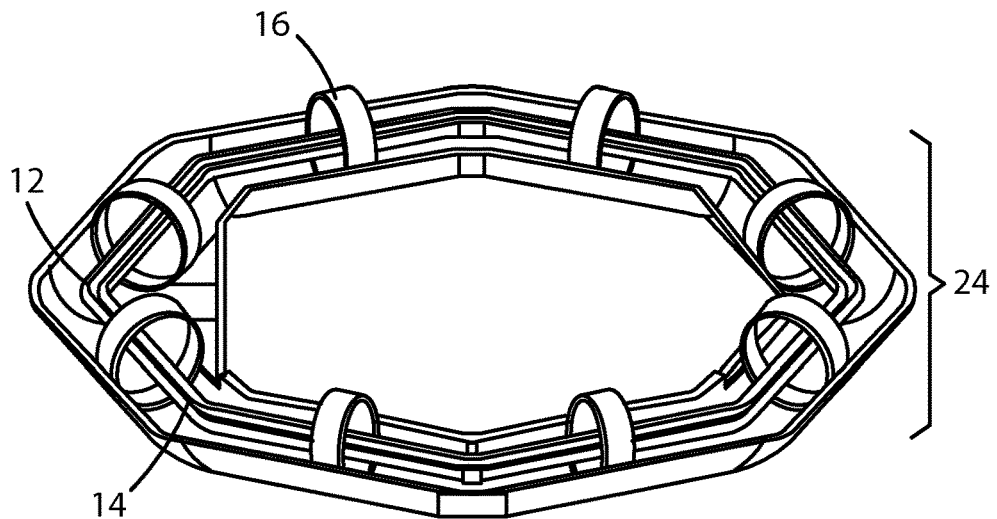
FIGS. 2A and 2B illustrate a two-stage suspension system of EM receivers.
Figure 2B:
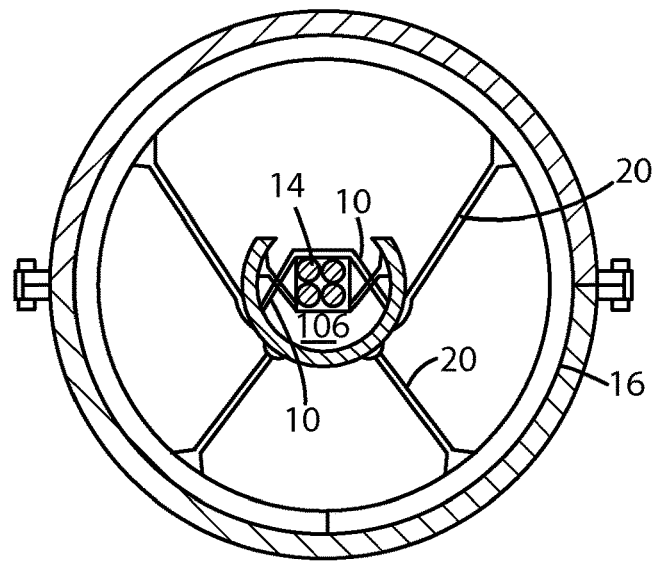
Figure 3:
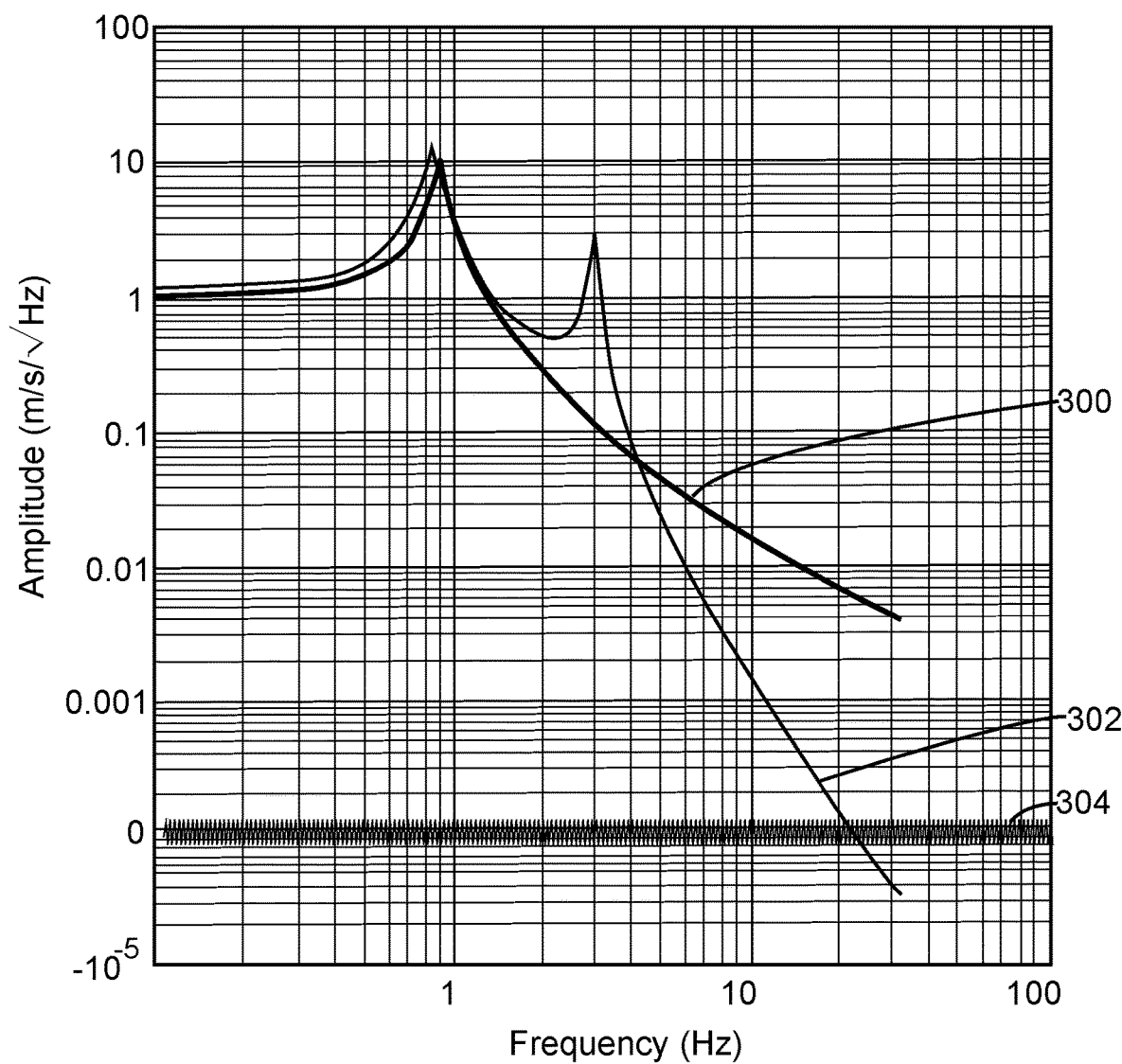
FIG. 3 is a graph illustrating a power spectrum for a one-stage suspension system versus a two-stage suspension system.

When testing the three-stage suspension mechanism discussed above, the inventor has found that the movement-induced noise which appears in the receiver coil is attenuated below the electronic noise floor at a low frequency, e.g., about 3 Hz, comparative to the typical 25 Hz discussed above with regard to FIG. 3. This unexpected result allows the novel receiver system to generate useful signals below the 25 Hz limit of the current receivers. To illustrate this unexpected result achieved by the three-stage receiver systems discussed above, the response of a traditional receiver system 1200 illustrated in FIG. 12 and a two-stage receiver system 1300 illustrated in FIG. 13 are plotted in FIG. 14.

Figure 14:
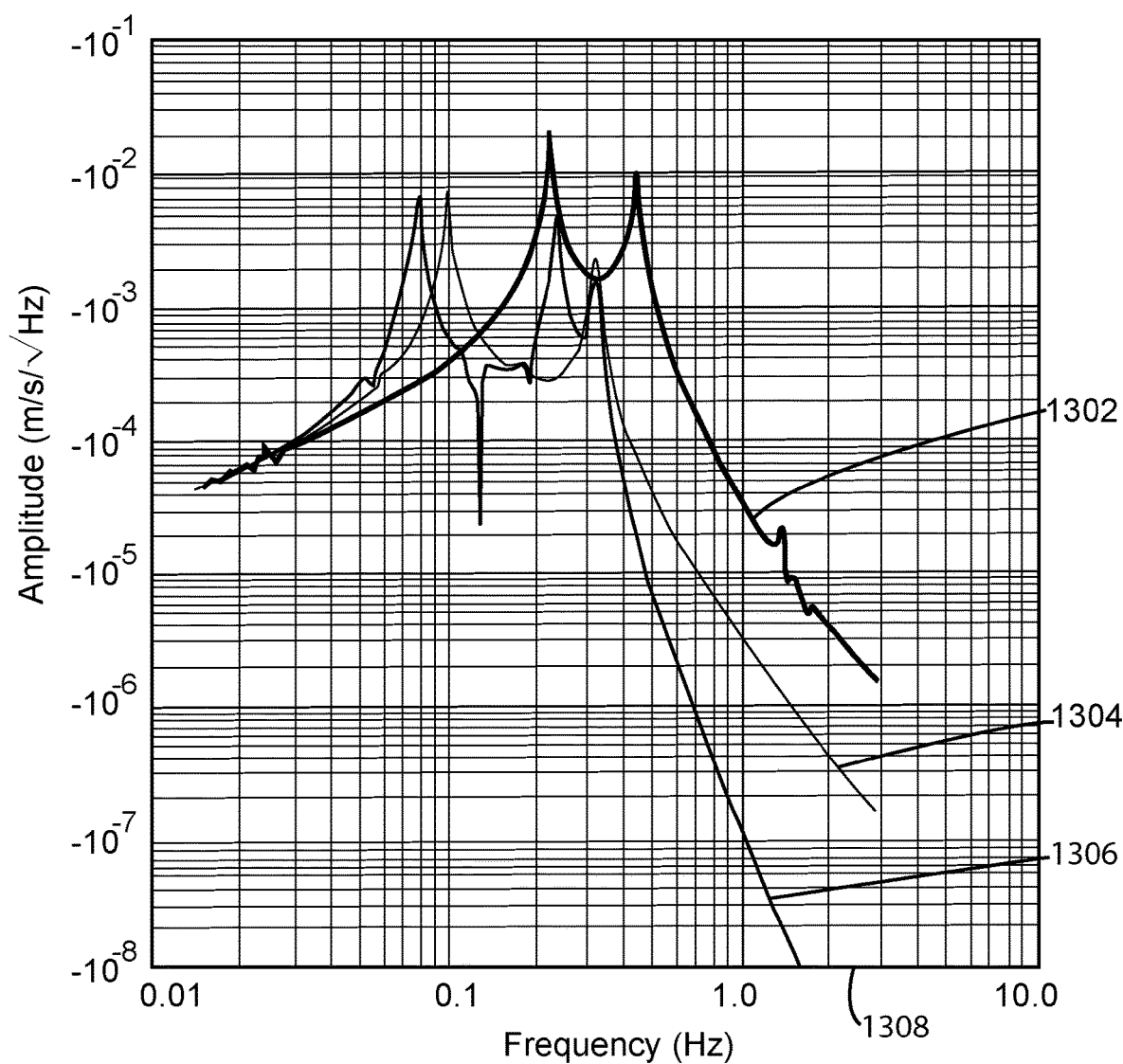
FIG. 14 is a graph illustrating the power spectrum of EM receivers having one-, two- and three-stage suspension mechanisms.

FIG. 14 shows the response signal's amplitude (power spectrum) for each of these systems plotted versus frequency. The response 1306 of the three-stage receiver system is shown intersecting the electronic noise floor at about 3 Hz, which means that the base frequency is now enlarged past 25 Hz, up to 3 Hz. This means that all frequencies above 3 Hz are now usable for characterizing the structure of the earth beneath its surface, a result that cannot be achieved by existing single- and dual-stage receiver systems. FIG. 14 also shows the two-stage receiver system 1300 and the reference system 1200 having base frequency starting at a much higher frequency, consistent with FIG. 3.

Figure 12:
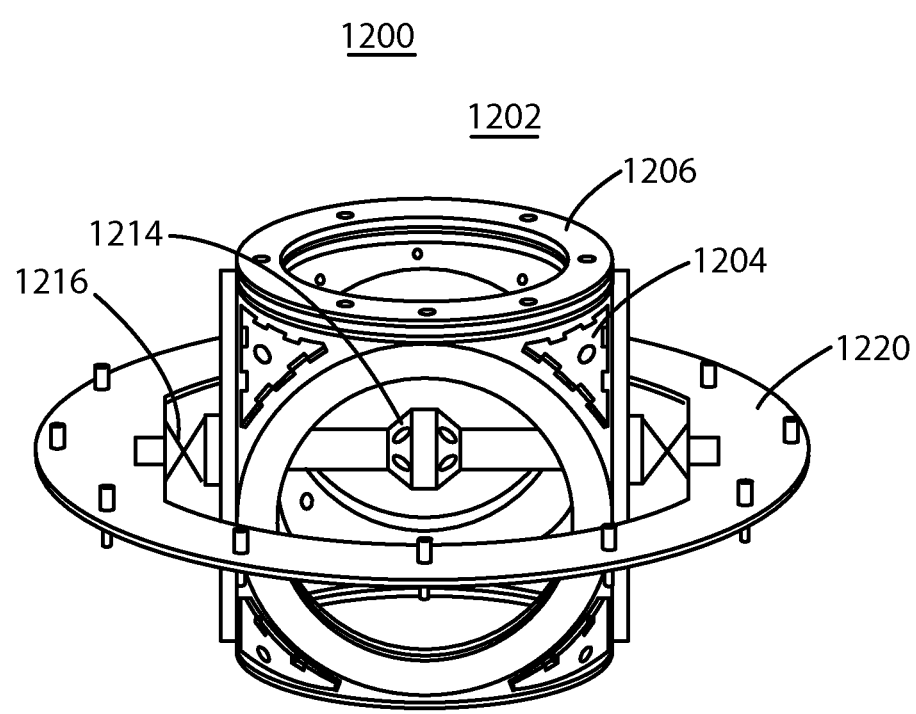
FIG. 12 is a schematic diagram of a reference one-stage EM receiver system.

Returning to FIG. 12, receiver system 1200 includes a receiver assembly 1202 that includes coil support 1204, coils 1206, and spindle 1214. Spindle 1214 is attached with a flexible member 1216 to outer ring 1220. This structure has some resemblance to the structure shown in FIG. 5A, but the size of coil assembly 1202 and outer ring 1220 in FIG. 12 is substantially the same as the size of outside cage 640 of FIG. 6.

Figure 13:
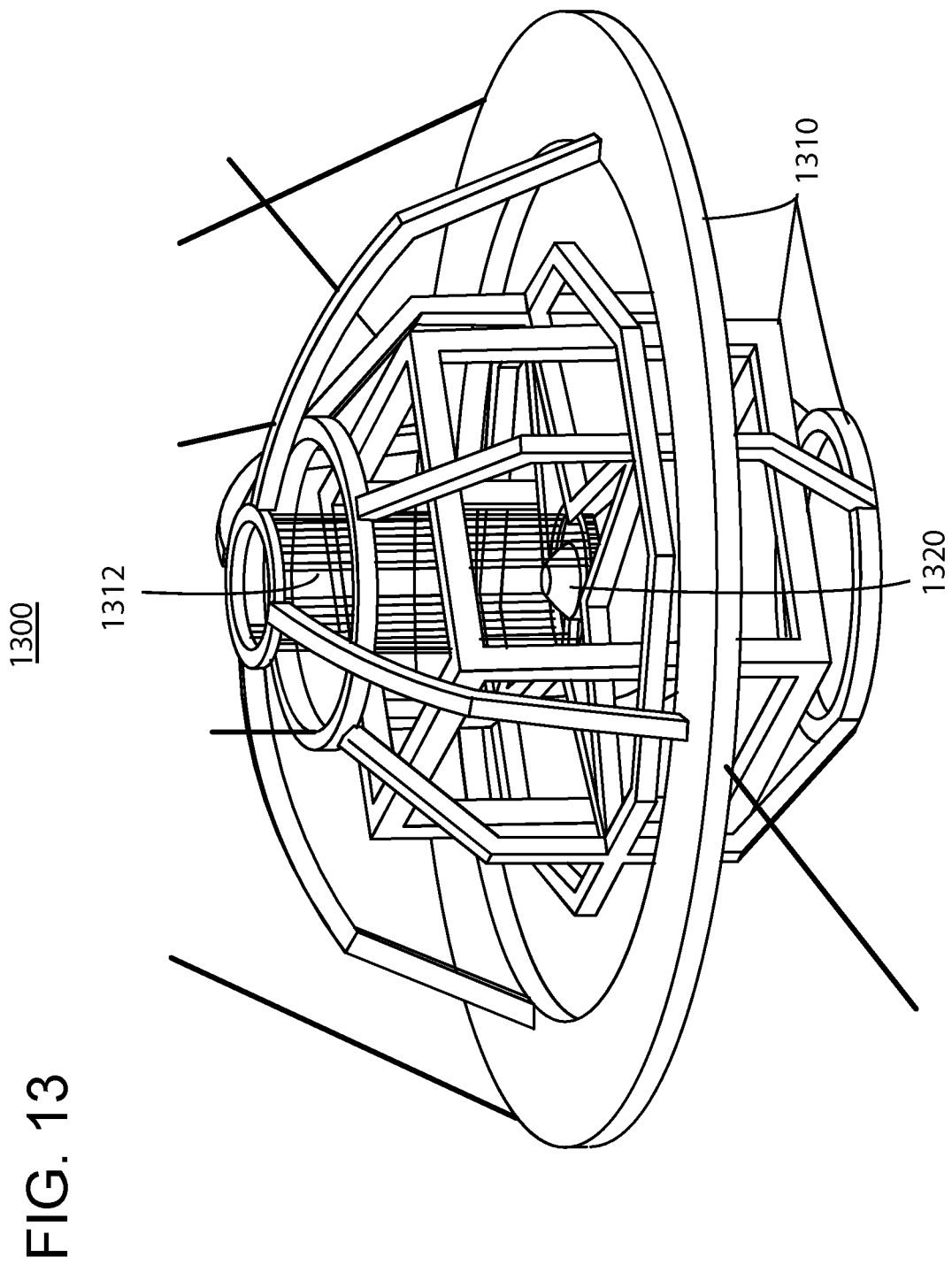
FIG. 13 is a schematic diagram of a two-stage EM receiver system.

FIG. 13 shows a two-stage receiver system 1300 having an external rigid structure 1310 connected by elastic members 1312 to receiver assembly 1320 (located in the center of the figure). Receiver assembly 1320 houses another elastic member (not shown), which may be similar to the structure shown in FIG. 5A.

Figure 15:
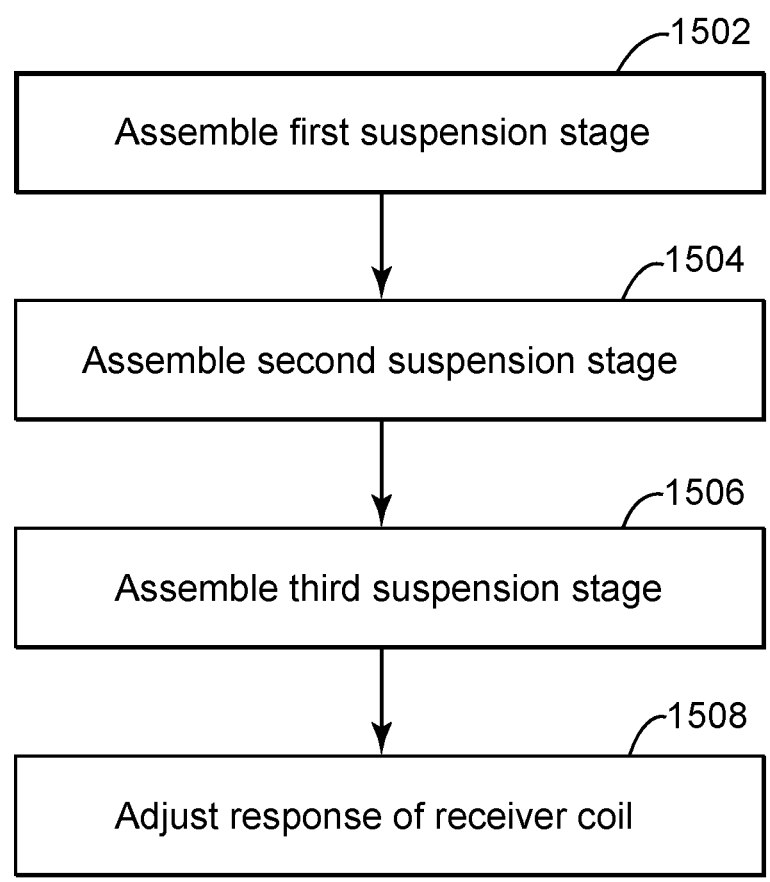
FIG. 15 is a flowchart of a method for assembling a three-stage suspension mechanism.

A method for assembling a three-stage suspension system as discussed above with regard to FIGS. 5A-11 is now discussed with regard to FIG. 15. In step 1502, a first-stage suspension mechanism is assembled by inserting a spindle into a coil assembly and connecting the spindle with the first elastic member to the coil assembly so that the coil assembly can oscillate relative to the spindle. In step 1504, a second-stage suspension mechanism is assembled by using a second elastic member to connect the coil assembly to an inner cage so that the coil assembly can oscillate relative to the inner cage. The second elastic member may include plural cords that are vertically suspended between the coil assembly and the inner cage. In step 1506, a third-stage suspension mechanism is assembled by using a third elastic member to connect the inner cage to an outer cage so that the inner cage can oscillate relative to the outer cage. In step 1508, the response of the receiver coil is measured for the ELF range, and at least one of the first to third elastic materials are adjusted. For example, this step may result in more or fewer elastic elements being present, or in replacing one or more elastic elements of a first type with one or more elastic elements of a second type, where the first type is one type of material and the second type is a second type of material. For example, the first type of material may be rubber, and the second type of material may be plastic. In another application, both the first and second types of material are rubber, but have different characteristics, e.g., chemical composition, length, diameter, etc. In this step, the response of the EM receiver coil can be adjusted to reach a target of 3 Hz. Those skilled in the art would understand that the target may be any number between 3 and 25 Hz. In this last step, it is possible that at least one of the first, second and third elastic members are adjustable so that a damping frequency changes. Alternatively, it is possible that each of the first, second and third elastic member are adjustable so that a damping frequency changes.

There are many possible implementations of the geophysical system discussed above. The geophysical system can be passive, measuring the ambient electromagnetic field, or be active and employ a transmitter which generates an excitation electromagnetic field. An electromagnetic geophysical system may include many peripheral sensors to determine the position or orientation or state of the electromagnetic measurement, such as a Global Positioning System (GPS), radar or laser altimeter, gyroscopes or inclinometers measuring transmitter or sensor positions, thermometers, or other sensors measuring other geophysical data (such as radar or laser for topography, gravity or gradiometers sensors, spectrometer sensors, magnetometers to measure the ambient earth magnetic field, etc.). Consequently, there are also many different methods to record, process, combine and control all of these signals and sensors.

As also will be appreciated by one skilled in the art, the exemplary embodiments may be embodied in a wireless communication device, a telecommunication network, as a method or in a computer program product. Accordingly, the exemplary embodiments may take the form of an entirely hardware embodiment or an embodiment combining hardware and software aspects. Further, the exemplary embodiments may take the form of a computer program product stored on a computer-readable storage medium having computer-readable instructions embodied in the medium. Any suitable computer-readable medium may be utilized, including hard disks, CD-ROMs, digital versatile discs (DVD), optical storage devices or magnetic storage devices such as a floppy disk or magnetic tape. Other non-limiting examples of computer-readable media include flash-type memories or other known types of memories.

This written description uses examples of the subject matter disclosed to enable any person skilled in the art to practice the same, including making and using any devices or systems and performing any incorporated methods. For greater clarity, the figures used to help describe the invention are simplified to illustrate key features. For example, figures are not to scale and certain elements may be disproportionate in size and/or location. Furthermore, it is anticipated that the shape of various components may be different when reduced to practice, for example. The patentable scope of the subject matter is defined by the claims, and may include other examples that occur to those skilled in the art. Such other examples are intended to be within the scope of the claims. Those skilled in the art would appreciate that features from any embodiments may be combined to generate a new embodiment.

The disclosed embodiments provide a method and EM receiver system capable of recording EM signals within a very low frequency range. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The invention claimed is:

1. An electromagnetic (EM) receiver system for measuring EM signals, the EM receiver system comprising:
a platform;
at least one coil for measuring EM signals;
a coil support to which the at least one coil is fixedly attached; and
first to third suspension mechanisms connecting the platform to the coil support so that the coil support oscillates relative to the platform, and the first to third suspension mechanisms attenuate a motion induced noise introduced by towing the receiver system above ground,
wherein the first suspension mechanism connects the coil support to a spindle, the second suspension mechanism connects the spindle to an inner cage, and the third suspension mechanism connects the inner cage to an outer cage.

2. The receiver system of claim 1, wherein the first suspension mechanism is configured such that the at least one coil rotates about a center of mass of the coil support.

3. The receiver system of claim 1, further comprising:
at least one sensor to determine a position or orientation of the receiver system.

4. The receiver system of claim 3, wherein the at least one sensor is a GPS system, a gyroscope, an inclinometer or a magnetometer.

5. The receiver system of claim 1, wherein the outer cage is made of two distinct parts.

6. The receiver system of claim 1, further comprising:
a housing that encloses the coil support, the inner cage and the outer cage.

7. The receiver system of claim 1, wherein the coil support is configured to house three pairs of coils, one for each axis of an orthogonal system.

8. A method for attenuating motion induced noise in an electromagnetic (EM) receiver system for measuring EM signals, the method comprising:
providing a platform; and
fixedly attaching at least one coil for measuring EM signals to a coil support and attaching the coil support to the platform with first to third suspension mechanisms,
wherein the coil support oscillates relative to the platform, and the first to third suspension mechanisms attenuate the motion induced noise introduced by towing the receiver system above ground, and
wherein the first suspension mechanism connects the coil support to a spindle, the second suspension mechanism connects the spindle to an inner cage, and the third suspension mechanism connects the inner cage to an outer cage.

9. The method of claim 8, wherein the first suspension mechanism is configured such that the at least one coil rotates about a center of mass of the coil support.

10. The method of claim 8, further comprising:
attaching at least one sensor to determine the position or orientation of the receiver system.

11. The method of claim 10, wherein the at least one sensor is a GPS system, a gyroscope, an inclinometer or a magnetometer.

12. The method of claim 8, wherein the outer cage is made of two distinct parts.

13. The method of claim 12, wherein a housing encloses the coil support, the inner cage and the outer cage.

14. The method of claim 8, wherein the coil support is configured to house three pairs of coils, one for each axis of an orthogonal system.

15. The method of claim 8, wherein the three suspension mechanisms are adjustable so that a power spectrum of the recorded signals is adjustable.

* * * * *